(12) United States Patent
Mori et al.

(10) Patent No.: US 7,867,561 B2
(45) Date of Patent: Jan. 11, 2011

(54) CIRCUIT PATTERN FORMING METHOD AND CIRCUIT PATTERN FORMING DEVICE

(75) Inventors: Takashi Mori, Tokyo (JP); Yuji Tsuruoka, Kawasaki (JP); Masao Furukawa, Yokohama (JP); Seiichi Kamiya, Yokohama (JP); Nobuhito Yamaguchi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 132 days.

(21) Appl. No.: 11/454,862

(22) Filed: Jun. 19, 2006

(65) Prior Publication Data

US 2006/0290736 A1       Dec. 28, 2006

(30) Foreign Application Priority Data

Jun. 22, 2005    (JP) .............................. 2005-181622

(51) Int. Cl.
    *B41J 29/393*    (2006.01)
(52) U.S. Cl. ............................. 427/256; 427/58; 347/12
(58) Field of Classification Search ................. 428/901; 427/63, 98, 102, 58, 256; 347/12, 148
    See application file for complete search history.

(56) References Cited

U.S. PATENT DOCUMENTS

| | | | | |
|---|---|---|---|---|
| 6,631,972 B2 * | 10/2003 | Yazawa | .......................... | 347/23 |
| 6,976,748 B2 * | 12/2005 | Yabe et al. | ...................... | 347/43 |
| 6,994,414 B2 | 2/2006 | Hashimoto et al. | ............. | 347/19 |
| 7,393,081 B2 | 7/2008 | Maekawa et al. | .............. | 347/40 |
| 2003/0083203 A1 | 5/2003 | Hashimoto et al. | ........... | 505/100 |
| 2003/0198789 A1 * | 10/2003 | Koyama et al. | ........... | 428/195.1 |
| 2003/0232128 A1 * | 12/2003 | Furusawa et al. | .............. | 427/58 |
| 2004/0145858 A1 | 7/2004 | Sakurada | ...................... | 361/600 |

(Continued)

FOREIGN PATENT DOCUMENTS

JP       7-245467       9/1995

(Continued)

OTHER PUBLICATIONS

Japanese Office Action dated Dec. 26, 2008, issued in corresponding Japanese patent application No. 2006-166456.

(Continued)

*Primary Examiner*—Michael Cleveland
*Assistant Examiner*—Tabassom Tadayyon Eslami
(74) *Attorney, Agent, or Firm*—Fitzpatrick, Cella, Harper & Scinto

(57) ABSTRACT

A circuit pattern forming method includes a first ejection step of ejecting large droplets of a circuit pattern forming liquid onto a substrate, by causing a liquid ejection head to scan the substrate, to form first dots of the liquid on the substrate with gaps between the first dots, a second ejection step of ejecting, from the liquid ejection head, before the first dots formed on the substrate solidify, and while the liquid ejection head is caused to scan the substrate in the first ejection step, a small droplet, which is smaller in size than the large droplets, to form a second dot of the liquid between the first dots of the liquid on the substrate and, thereby to form a liquid circuit pattern by mixing the first dots and the second dot together, and a fixing step of solidifying the liquid circuit pattern to form a circuit pattern on the substrate.

4 Claims, 19 Drawing Sheets

U.S. PATENT DOCUMENTS

| | | | |
|---|---|---|---|
| 2004/0241586 A1 | 12/2004 | Hirai et al. | 430/311 |
| 2004/0247842 A1 | 12/2004 | Koyama et al. | 428/195.1 |
| 2004/0263564 A1 | 12/2004 | Maekawa et al. | 347/40 |
| 2005/0093902 A1 | 5/2005 | Kato et al. | 347/9 |
| 2006/0013970 A1* | 1/2006 | Wada | 428/32.24 |
| 2006/0288932 A1 | 12/2006 | Mori et al. | 118/313 |
| 2006/0290736 A1 | 12/2006 | Mori et al. | 347/19 |
| 2006/0292496 A1 | 12/2006 | Furukawa et al. | 430/311 |
| 2007/0098882 A1 | 5/2007 | Koyama et al. | 427/96.1 |

FOREIGN PATENT DOCUMENTS

| | | |
|---|---|---|
| JP | 11-163499 | 6/1999 |
| JP | 2003-133691 | 5/2003 |
| JP | 2003-318133 | 11/2003 |
| JP | 2004-127676 | 4/2004 |
| JP | 2004-356296 | 12/2004 |
| JP | 2005-51216 | 2/2005 |

OTHER PUBLICATIONS

Extended European Search Report (including European search opinion) dated Apr. 25, 2008, mailed in a Communication dated May 7, 2008, in copending European patent application No. 06 01 2740.

* cited by examiner

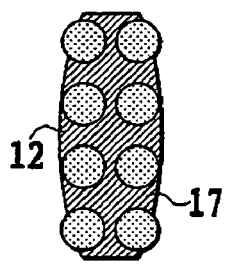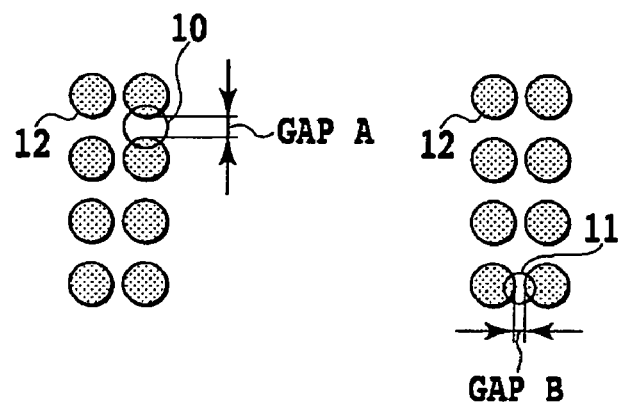
FIG.11A    FIG.11B    FIG.11C

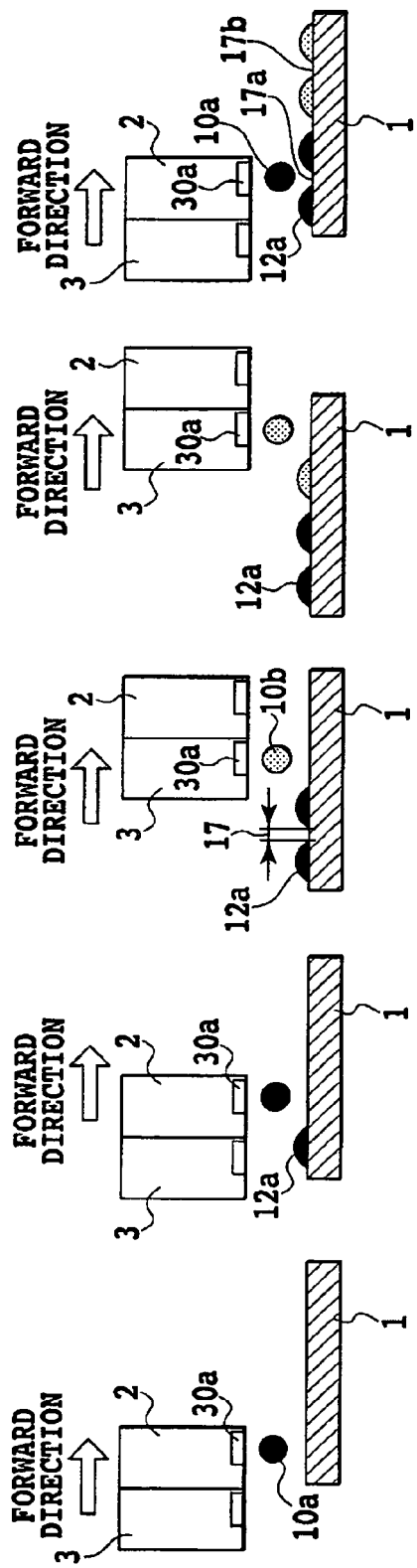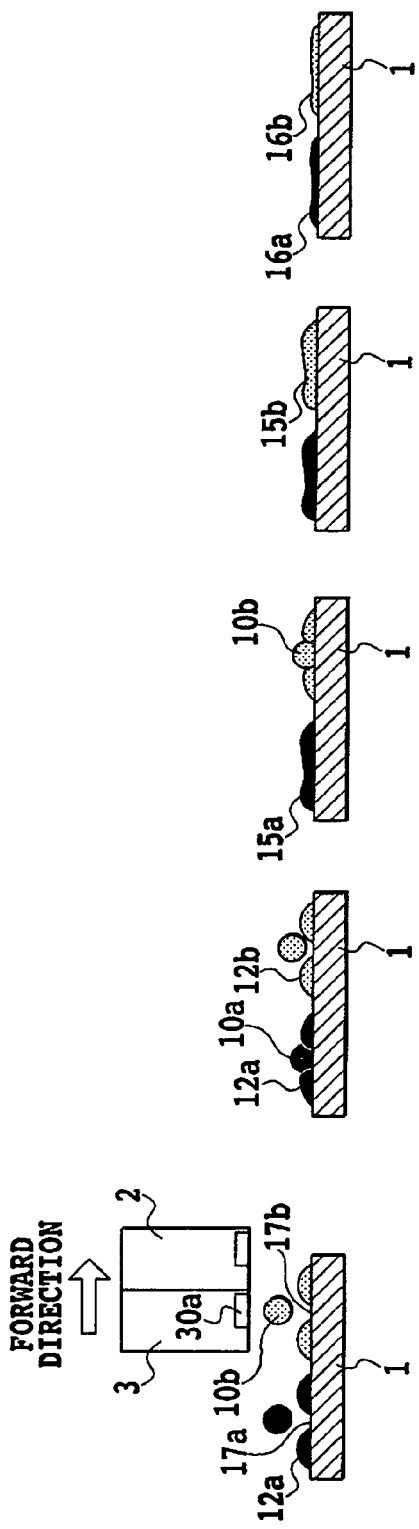

CIRCUIT PATTERN FORMING METHOD AND CIRCUIT PATTERN FORMING DEVICE

This application claims priority from Japanese Patent Application No. 2005-181622 filed Jun. 22, 2005, which is hereby incorporated by reference herein.

BACKGROUND OF THE INVENTION

1. Field of the Invention

The present invention relates to a circuit pattern forming method and a circuit pattern forming device, to form circuit patterns on circuit boards used in electronic devices, electrical devices, computers and communication devices, and, more particularly, to a circuit pattern forming method and a circuit pattern forming device that form circuits by ejecting a circuit pattern forming solution onto a substrate.

2. Description of the Related Art

Printed circuit boards installed in electronic devices, communication devices and computers are mounted with a variety of kinds of semiconductor devices, such as LSIs, and of electronic components. Many kinds of printed circuit boards are available, including those using ceramics as a base material, those using as a base material a composite material formed of a reinforcement material, such as glass fibers and a synthetic resin, such as epoxy resin, and those using a flexible film, such as polyester resin and aramid resin, as the base material. Most of the conventional printed circuit boards have used a one-sided or double-sided substrate. As electronic devices have been miniaturized and packed in higher density, laminated circuit patterns have come to be used. At present eight- or sixteen-layer printed circuit boards are becoming a mainstream. At the same time, circuit patterns are also being formed of increasingly finer circuits, and their density is rapidly increasing.

Japanese Patent Application Laid-Open No. 07-245467 (1995) discloses a method of forming circuits by directly ejecting a conductive solution and an insulating solution onto a surface of a substrate by an ink jet method, to draw conductive patterns and insulating patterns. This method obviates a subtractive method, which, in turn, offers an advantage of being able to reduce the number of steps required and to eliminate the need to process a waste liquid produced during plating and etching steps.

In Japanese Patent Application Laid-Open No. 07-245467 (1995), referenced above, circuit patterns are formed by ejecting ink droplets from an ink jet printer, such that adjoining droplets on a substrate overlap each other. This is because, if the adjoining droplets fail to overlap, those portions that are out of contact with each other will lead to an open circuit. With this method, however, droplets ejected onto the substrate contact and merge with the existing droplets on the substrate and may form liquid puddles.

Let us explain the liquid puddles thus formed.

FIG. 18 shows liquid puddles 201, 203 formed on circuit patterns 200. The puddles 201, 203 are formed by the droplets ejected onto the substrate merging with and becoming attracted to the existing droplets that have already landed on the substrate. Further, as the liquid puddles expand, the puddles themselves contact other patterns, as indicated at 203, causing short-circuits. On the other hand, when the ejected droplets land at positions where they fail to contact the existing droplets on the substrate because of ejection errors of an ejection head, these droplets become fixed, isolated from the patterns that they are supposed to contact, which will cause an open circuit, as indicated at 202 of FIG. 18.

Under these circumstances, proposals have been made to prevent forming of such liquid puddles and, therefore, the problems of open-circuits and short-circuits, as disclosed in Japanese Patent Application Laid-Open No. 2003-133691. This method, as shown in FIGS. 19A and 19B, ejects droplets 1003 from the head 1002 to form dots 1006 on the substrate 1001 in a first ejection step. The dots 1006 are formed at a greater pitch 1005 than a diameter 1004 of the dots formed by the droplets landing on the substrate 1001. The pitch refers to a distance between the centers of the adjoining dots.

Then, the printed substrate is subjected to a drying step to fix the dots 1006 formed by the first ejection step. After this, a second ejection step is performed to form dots 1007. In forming the dots 1007, droplets 1003 are ejected to positions different from those of the first ejection step at the same pitch 1005 as the first ejection step. Then, the substrate is dried again to fix the dots 1007 formed in the second ejection step. After this, dots 1008 are formed in a third ejection step. In forming the dots 1008, droplets 1003 are ejected at a smaller pitch than the pitch 1005 of the first ejection step.

As described above, in Japanese Patent Application Laid-Open No. 2003-133691, dots are formed on the substrate at intervals and then dried, after which, droplets are ejected between the formed dots. With this arrangement, the landing droplets are not attracted to the existing dots on the substrate, preventing the formation of liquid puddles. Further, Japanese Patent Application Laid-Open No. 2003-133691, as shown in FIG. 19B, increases the thickness of circuits formed, to eliminate such problems as open-circuits and short-circuits.

The technology of Japanese Patent Application Laid-Open No. 2003-133691, however, has a problem that, since the drying step is executed after each ejection step, and the patterns are formed thick, the thickness of the circuit patterns after the third ejection step becomes uneven, impairing the flatness of the surface. This technology is, therefore, not suited for forming circuit patterns that are thin, uniform in thickness and flat, which are essential requirements in forming multilayered circuit boards. In recent years, circuit boards are formed with an increasingly higher level of circuit density, and there are growing needs for circuit patterns that can be formed of thin films in a multilayer structure. These demands, however, cannot be met with the technology of Japanese Patent Application Laid-Open No. 2003-133691.

SUMMARY OF THE INVENTION

An object of this invention is to provide a circuit pattern forming device and a circuit pattern forming method, both of which can eliminate problems, such as open circuits and short circuits, when forming a circuit pattern on a substrate, and which can form a circuit pattern of a thin film uniform in thickness.

To achieve the above objective, the present invention has the following construction.

According to a first aspect, the present invention provides a circuit pattern forming method which comprises a first ejection step of ejecting a circuit pattern forming liquid onto a substrate by using a liquid ejection means to form dots of the liquid on the substrate with gaps between them, a second ejection step of ejecting the liquid from the liquid ejection means to further form dots of the liquid between the dots of the liquid on the substrate, thereby forming a liquid circuit pattern, and a fixing step of solidifying the liquid circuit pattern.

According to a second aspect, the present invention provides a circuit pattern forming device to form a circuit pattern by ejecting a circuit pattern forming liquid onto a substrate from a liquid ejection means to form a plurality of dots of the liquid on the substrate, the circuit pattern forming device comprising moving means to move the liquid ejection means relative to the substrate, detection means to detect a position of the liquid ejection means with respect to the substrate and control means to form, based on the position of the liquid ejection means with respect to the substrate as detected by the detection means and on circuit pattern forming data, dots of the liquid on the substrate with gaps between the dots, and then further form dots of the liquid on the substrate between the dots of the liquid on the substrate, thereby forming a liquid circuit pattern.

With this invention, a flat, thin film with an almost uniform thickness can easily be formed on the substrate by ejecting droplets onto the substrate with gaps between the dots, and then further ejecting droplets to the gaps between those dots that need to be connected, before the previously formed dots on the substrate solidify. Therefore, this invention can alleviate the problem of open circuits and short circuits, and undesired conduction, and can also meet requirements for higher density and multilayer construction demanded by circuit boards of recent years.

The above and other objects, effects, features and advantages of the present invention will become apparent from the following description of embodiments thereof taken in conjunction with the accompanying drawings.

BRIEF DESCRIPTION OF THE DRAWINGS

FIGS. 11A to 11C are schematic diagrams showing arrangements of dots formed on the substrate 1, as seen from above;

FIGS. 12A to 12J are a sequence of steps executed in a circuit pattern forming method in a second embodiment of this invention;

DETAILED DESCRIPTION OF PREFERRED EMBODIMENTS

Now, embodiments of this invention will be described in the following order.
1. Construction of Circuit Pattern Forming Device
2. Configuration of Control System
3. Control of Circuit Forming Position
4. Material Used in Circuit Pattern Forming Process
4-1. Substrate
4-2. Conductive Solution and Insulating Solution
5. Circuit Pattern Forming Process

1. Construction of Circuit Pattern Forming Device

As one embodiment of this invention, a circuit pattern forming device used to form a circuit pattern made up of an insulating pattern and a conductive pattern on a substrate will be described.

Figure 1:
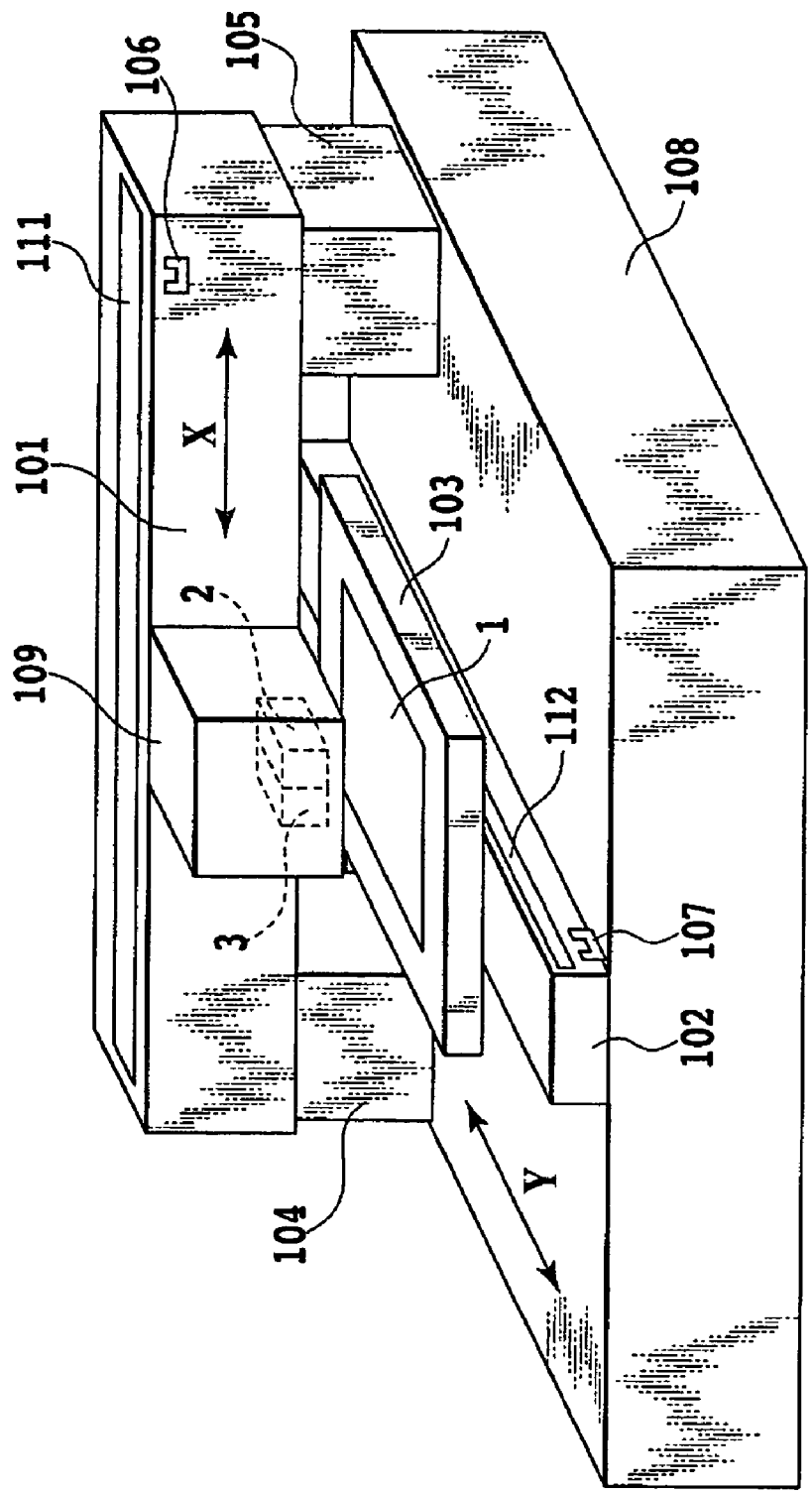
FIG. 1 is a perspective view showing an outline construction of a circuit pattern forming device used in the embodiments of this invention.

The circuit pattern forming device used in this embodiment of FIG. 1 has a carriage 109 that reciprocally moves in a main scan direction (X direction), and a stage 103, on which a substrate 1, to be formed with circuit patterns, is mounted. On this carriage are mounted a liquid ejection head 2 to eject an insulating solution onto the substrate 1, a liquid ejection head 3 to eject a conductive solution onto the substrate 1, and two tanks (not shown) to supply the insulating solution and the conductive solution to the liquid ejection heads 2, 3, respectively.

Figure 2:
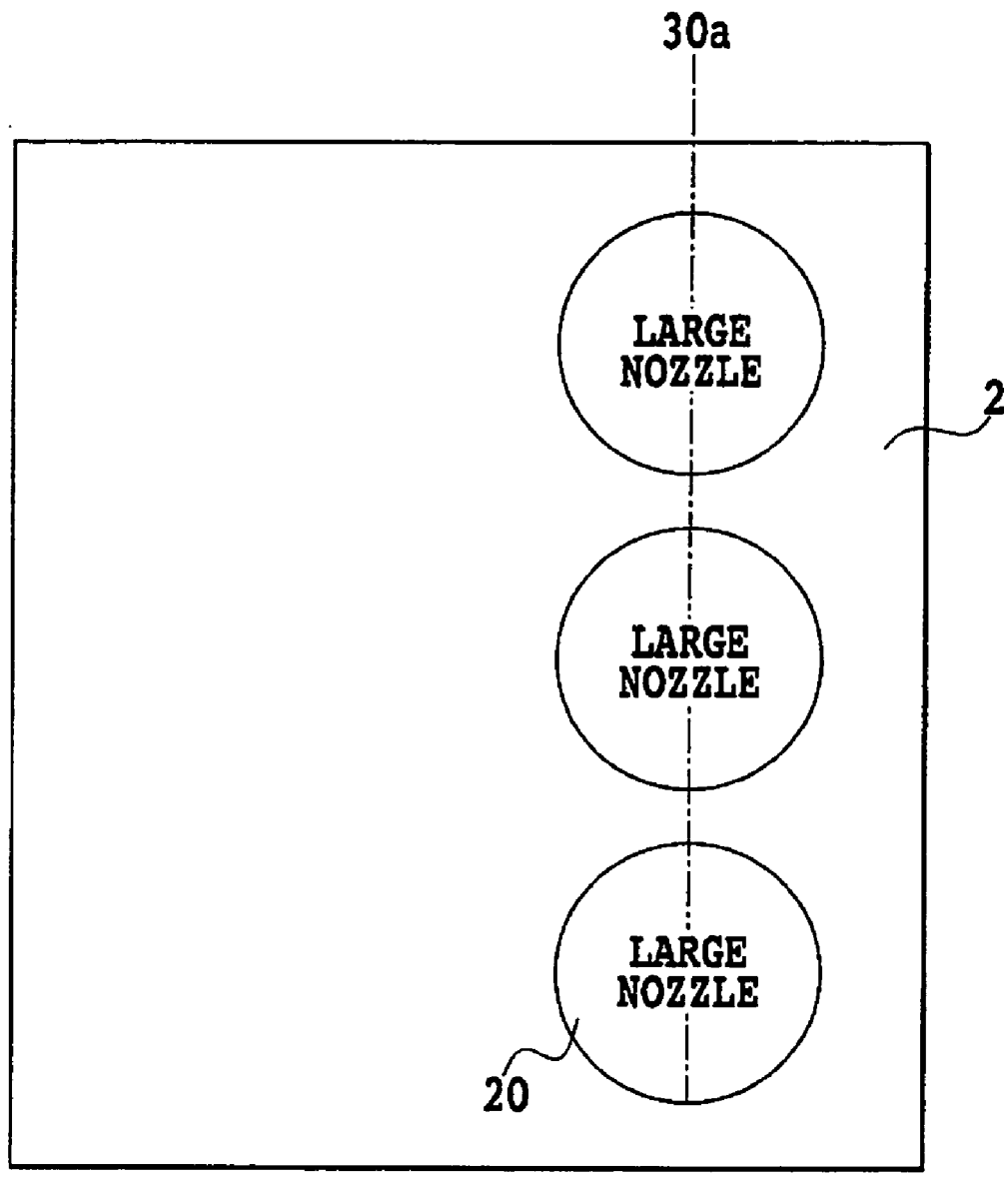
FIG. 2 is a bottom view schematically showing a nozzle array arranged in an orifice face of a liquid ejection head used in a first embodiment of this invention.

FIG. 2 schematically shows a nozzle array arranged in an orifice face of the liquid ejection head 2. As shown in FIG. 2, the liquid ejection head 2 has an array 30a of large nozzles 20 arranged at equal intervals that eject relatively large droplets. Though not shown in FIG. 2, the liquid ejection head 3 also has an array 30a of large nozzles 20, as with the liquid ejection head 2.

In FIG. 1, a CR linear motor (carriage linear motor) 101 drives the carriage 109 in a forward direction (also referred to as a forward scan) and in a backward direction (also referred to as a backward scan). As a means for moving the substrate 1 in a Y direction, there are provided the stage 3 and an LF linear motor (line feed linear motor) 102. The LF linear motor 102 is firmly secured to a flat bed 108, so that the upper surface of the stage 103 carrying the substrate 1 can be kept parallel to the upper surface of the bed 108 at all times if the stage 103 is moved. The CR linear motor 101 is secured to highly rigid bases 104, 105 erected on the bed 108.

The carriage 109 reciprocally moves in the main scan direction (X direction) along an upper surface of the bed, i.e., a stage surface. The CR linear motor 101 and the LF linear motor 102 each incorporate a linear encoder 111, 112 and an origin sensor 106, 107. The outputs of the linear encoder 111, 112 and the origin sensor 106, 107 are used as a servo control input for driving the linear motors. Further, the linear encoder 111 on the carriage side is used to generate a solution ejection timing.

Further, the circuit pattern forming device of this embodiment is connected with a personal computer (not shown) as a host device. Based on figure information (circuit pattern forming information) sent from this personal computer, the circuit pattern forming device moves the liquid ejection heads 2, 3, ejects solutions and moves the stage 103 to form a circuit pattern on the surface of the substrate 1.

A heater (not shown) is embedded in a lower part of the stage 103 on which the substrate 1 is mounted. The heater heats the circuit pattern drawn on the substrate to fix it. In this embodiment, since the heater is intended to fix the circuit pattern, its heating temperature is set to 40-70° C., enough to fix the liquid on the substrate 1, even in this simple construction. With the fixing complete, no functional problem will arise in the circuit board. However, for an improved conductivity of the conductive pattern and an improved insulation performance of the insulating pattern, the circuit board may be burned in a separate baking device.

2. Configuration of Control System

Next, the control system for the circuit pattern forming device in this embodiment will be described.

Figure 3:
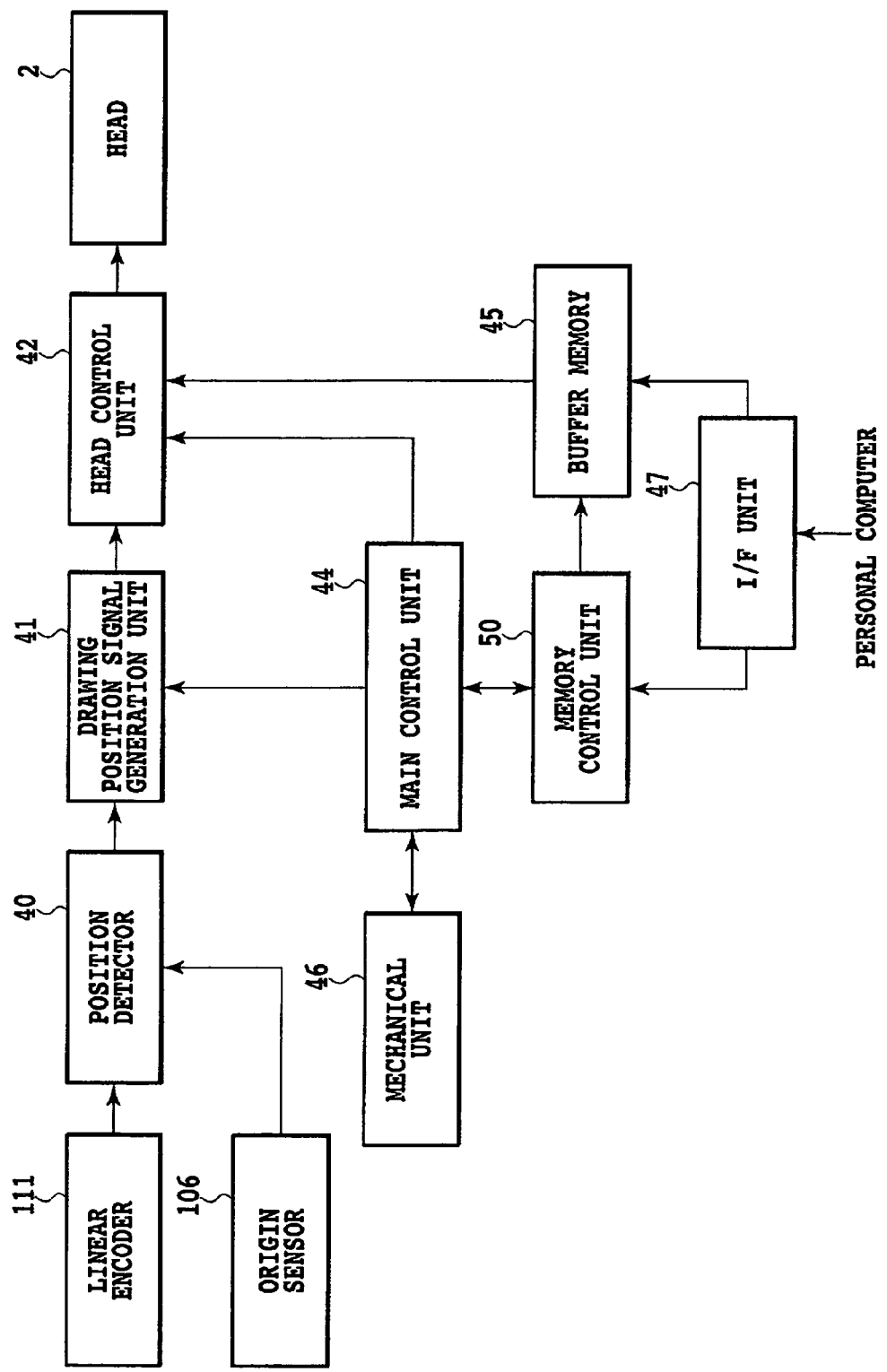
FIG. 3 is a block diagram schematically showing an overall configuration of a control system installed in the circuit pattern forming device of the embodiments of this invention.

FIG. 3 is a block diagram schematically showing an overall configuration of the control system in the circuit pattern forming device of this embodiment. A mechanical unit 46 includes the CR linear motor 101 for moving, in the main scan direction, the carriage 109 carrying the liquid ejection head 2, and also, the LF linear motor 102 for transporting the stage 103 carrying the substrate 1.

A main control unit 44 is a central part of the control system that controls the entire circuit pattern forming device of this embodiment, including the liquid ejection head and the mechanical unit 46. The main control unit 44 has a CPU, a ROM in which operation programs are stored, and a work RAM that allows reading and writing of a variety of data.

The main control unit 44 outputs a control signal to the mechanical unit 46 to perform a mechanical control, for example, on the movement of the carriage 109 and stage 103. It also transfers signals to and from a head control unit 42, a memory control unit 50 and a drawing position signal generation unit 41 to control the operation of the liquid ejection head 2. An I/F unit 47 is an interface between the personal computer (not shown) and the circuit pattern forming device. The I/F unit 47 receives a command and circuit pattern drawing data (circuit pattern data) from the host (personal computer). The memory control unit 50 transfers the command from the I/F unit 47 to the main control unit 44 and, under the control of the main control unit 44, generates an address signal and a write timing signal, to write the circuit pattern drawing data into a buffer memory 45.

Further, the main control unit 44 analyzes the command received from the I/F unit 47 and, according to the result of the analysis, sets drawing conditions, such as a drawing speed and a drawing resolution. Then, based on the drawing conditions, the main control unit 44 controls the mechanical unit 46 and the drawing position signal generation unit 41 to execute the drawing operation under the predetermined conditions.

Further, the circuit pattern drawing data received from the personal computer (not shown) is stored in the buffer memory 45 or a temporary memory, and then transferred to the head control unit 42 by the control of the memory control unit 50 that has received the command from the main control unit 44.

In synchronism with the drawing position signal output from the drawing position signal generation unit 41, the head control unit 42 drives individual nozzles of the liquid ejection head, to draw a circuit pattern according to the circuit pattern drawing data transferred from the buffer memory 45.

3. Control of Circuit Forming Position

Next, the drawing position control method in the circuit pattern forming device of this embodiment will be described.

Figure 4A:
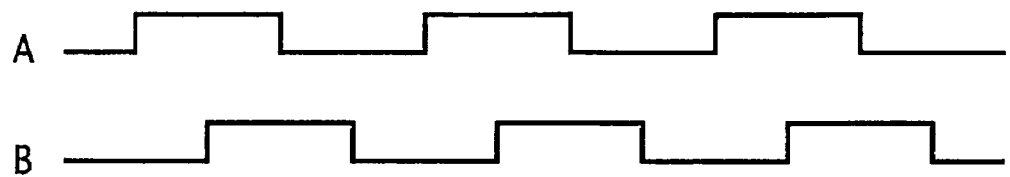
FIGS. 4A and 4B illustrate output signals of a linear encoder in the embodiments of this invention.
Figure 4B:
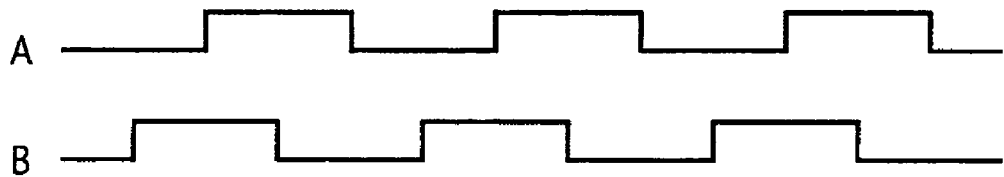

FIGS. 4A and 4B show output signals from the linear encoder 111. In the figure, two signals A and B, ninety degrees out of phase with each other, are generated by the linear encoder 111. FIG. 4A shows signals A, B generated when the carriage 109 moves in the forward direction, and FIG. 4B shows signals A, B generated when the carriage 109 moves in the backward direction. As shown in FIG. 4A, when the signal A leads the signal B by ninety degrees, the carriage 109 is moving in the forward direction. In this state, the pulse signal is counted up at its leading or trailing edge. When the signal A lags the signal B by ninety degrees, as shown in FIG. 4B, the carriage 109 is moving in the backward direction. In this state, the pulse signal is counted down.

By counting the output signal from the linear encoder 111, as described above, the mobility position of the moving carriage 109 can be determined. That is, a position detector 40 in FIG. 3 receives the two signals from the linear encoder 111 and the origin signal Z from the origin sensor 106, and determines a present absolute position of the carriage 109 in the main scan direction, i.e., the position from the origin.

Figure 5:
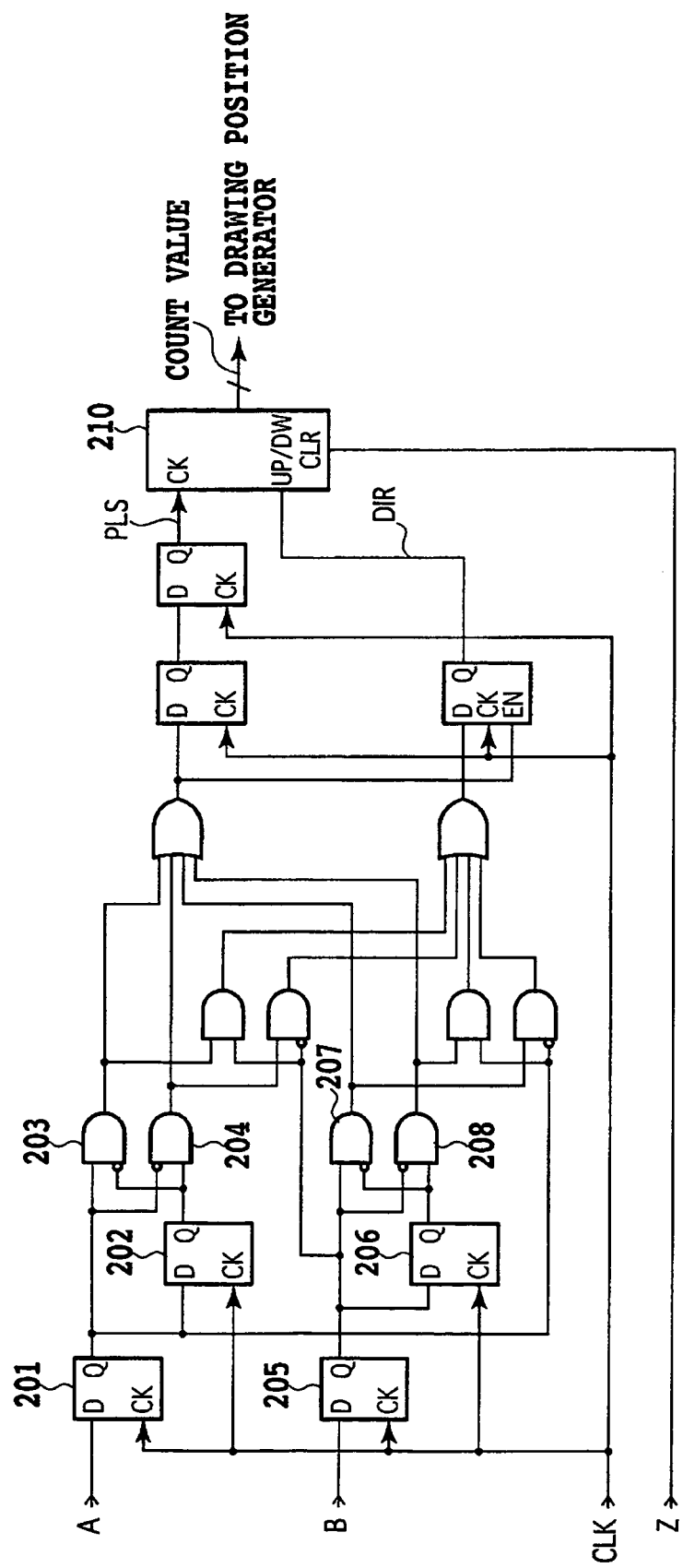
FIG. 5 is a block diagram showing an example circuit of a liquid ejection head position detector in this embodiment of the invention.

FIG. 5 shows an example circuit of the head position detector 40. The head position detector 40 produces a count signal (PLS) and an up/down signal, namely, a travel direction signal (DIR), based on the signal A, B from the linear encoder 111, the origin signal Z from the origin sensor 106, and a clock (CLK) for synchronization of logic timing. Components 201 through 204 in FIG. 5 constitute a circuit that detects timing of the rising and trailing edges of the signal A. A pulse synchronized with the rising edge of the signal A is output from the circuit 203, while a pulse synchronized with the trailing edge is output from the circuit 204.

Similarly, a circuit made up of components 205-208 of FIG. 5 detects the leading and trailing edges of the signal B. A pulse synchronized with the leading edge of the signal B is output from the circuit 207, while a pulse synchronized with the trailing edge is output from the circuit 208.

Figure 6:
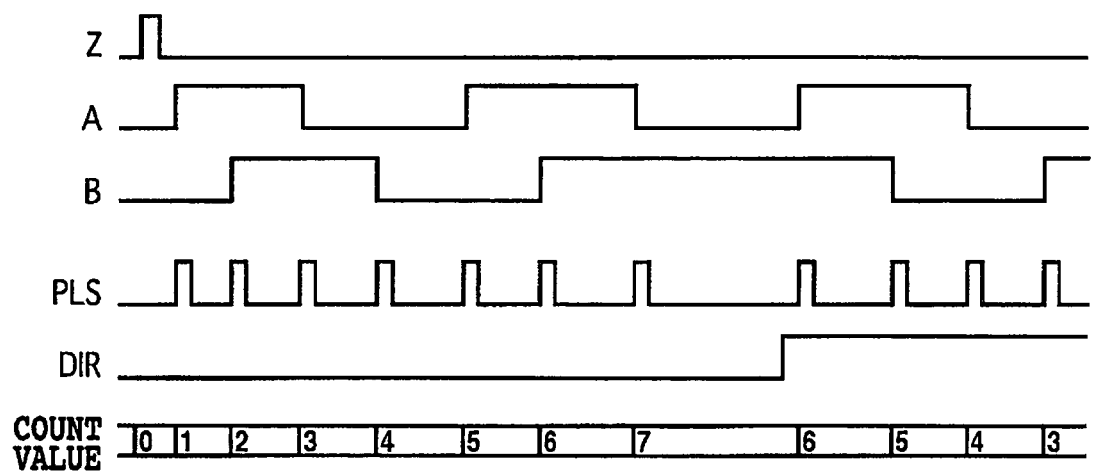
FIG. 6 is a timing chart showing output signals from various parts of the circuit of FIG. 5.

FIG. 6 is a timing chart showing output signals produced by various parts of the circuit of FIG. 5.

In FIG. 6, since the phase of the signal A leads the phase of signal B by ninety degrees, the travel direction signal DIR is low, representing the backward movement of the head. Conversely, from a middle point of FIG. 6 on, the signal A lags signal B, so the travel direction signal DIR goes high, representing the backward movement of the head. The count signal PLS is output at the rising and trailing edges of the two signals A, B.

The origin signal Z, the count signal PLS and the travel direction signal DIR are connected to input terminals of the up/down counter 210—reset (CLR), clock (CK) and up/down (UP/DW). Thus, when the carriage 109 moves to the origin position (home position) in response to an initialize command from the main control unit 44, the origin signal Z becomes active, clearing the count value to zero (count value=0). From this time on, with the count value=0 taken as an origin, the absolute position of the carriage 109 in the main scan direction is counted, and the count value is output to the drawing position signal generation unit 41.

Figure 7:
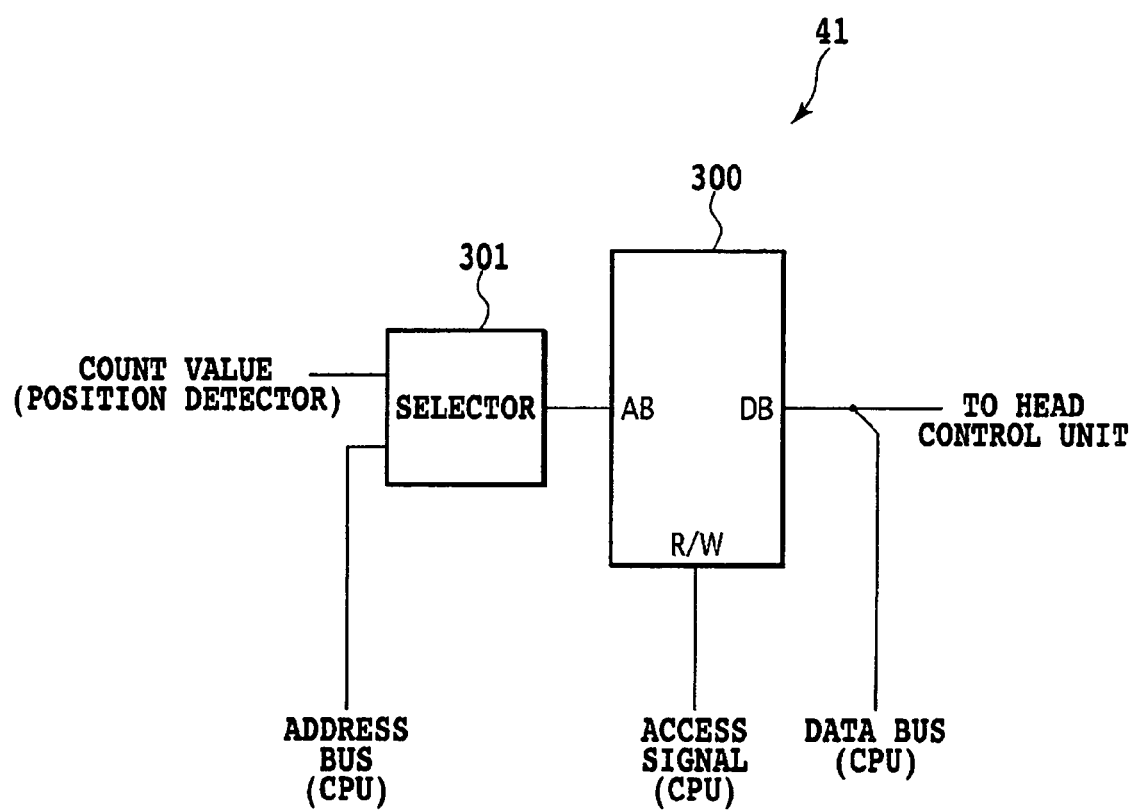
FIG. 7 is a block diagram of a drawing position signal generation unit of FIG. 3.

FIG. 7 is a block diagram of the drawing position signal generation unit 41. The count value generated by the head position detector 40 is connected via a selector 301 to an address input terminal (AB terminal) of the RAM 300. For direct reading/writing from the CPU of the main control unit 44, an address bus is connected via the selector 301 to the address input terminal of the RAM 300. Further, a data bus of the CPU in the main control unit 44 is connected to a data bus terminal (DB terminal) of the RAM 300 and an access signal of the CPU is connected to an R/W terminal of the RAM 300.

When writing data from the main control unit 44 into the RAM 300, the selector 301 is switched to the CPU side. During the drawing operation, the selector 301 is switched so that the count value is supplied to the address input of the RAM 300. As the carriage 109 travels, the RAM data of an address representing the position of the carriage 109 is output to the head control unit 42.

With the drawing data written into RAM 300 in advance from the CPU of the main control unit 44, a drawing position pulse is output to the head control unit 42 each time the carriage 109 reaches the drawing position. Upon receiving the drawing position pulse, the head control unit 42 drives the liquid ejection head 2 to eject a solution to the substrate 1.

Figure 8:
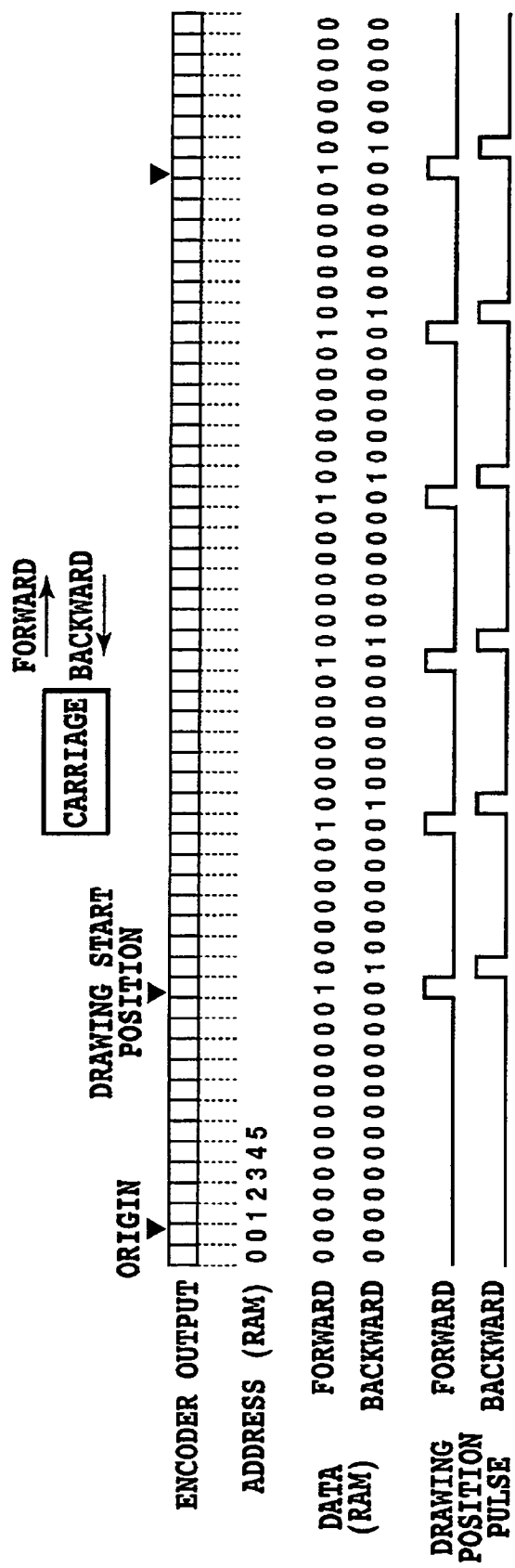
FIG. 8 is a timing chart showing an output timing of a drawing position pulse in the embodiments of this invention.

FIG. 8 is a timing chart showing an output timing of the drawing position pulse.

In FIG. 8, the address and data (RAM) represent an address and data of the RAM 300, respectively, showing two bits of data written into the RAM 300, one bit for the forward movement and one bit for the backward movement. The drawing position pulse in FIG. 8 is a pulse signal to provide the head control unit 42 with a drawing timing. When the carriage 109 moves, the bit corresponding to the forward or backward direction is selected and output, as shown in FIG. 8.

The forward direction pulse and the backward direction pulse shown in FIG. 8 do not agree in output timing. The reason for this is that, even if the head ejects droplets at the same position in the scan direction, the droplet landing positions on the substrate differ, depending on whether the liquid ejection head is moving in the forward direction or backward direction. That is, a droplet ejected when the head is moving in the forward direction shifts forward until it lands on the substrate. Conversely, a droplet ejected when the head is moving in the backward direction shifts backward. Therefore, the drawing position pulse timings are set so as to differentiate the droplet ejection position between the forward and backward head movements.

In FIG. 8, the drawing position pulse timing has been explained by taking up, as an example, a bidirectional drawing operation, in which the liquid ejection head performs drawing both in the forward and backward directions. In a one-way drawing operation, in which the drawing is done only in the forward direction, all the bits for the backward movement need to be set to zero. In this case, the drawing position pulse is not output when the carriage is moving in the backward direction.

While in FIG. 8 the data and the drawing position pulses for the RAM 300 are shown for only one set of forward and backward movements, for convenience, if the liquid ejection head 2 has a plurality of nozzle arrays (n arrays), as in this embodiment, or if there are two or more liquid ejection heads 2 (m heads), the number of data bits in the RAM 300 need only be increased to generate data for n arrays, or for m sets.

4. Material Used in Circuit Pattern Forming Process

[4-1. Substrate]

The substrate 1 used in this invention is shaped planar in the form of a film, a sheet and a plate. Because forming a circuit pattern layer includes a baking step, the substrate preferably has a high heat resistance. A substrate with a curved surface, rather than a planar surface, may be used if it can be formed with circuit patterns by the ink jet system. The substrate may use the following materials: ceramics, which are made to sinter alumina-silica, thermoplastic resin films, such as polyester film, aromatic polyamide film and polyimide film; cloths and nonwoven fabric of glass fibers, polyester fibers and aromatic polyamide fibers impregnated with thermoplastic resin and epoxy resin, and then hardened and shaped like a sheet; a glass epoxy laminated plate used for ordinary circuit boards; and a permeable substrate, paper and cloth. It is desired that the substrate used in this invention have a hydrophilic property. It is particularly preferred that the substrate be surface-treated so that the solution that has landed on the substrate has a surface tension enough to prevent it from spreading and wetting the substrate surface. Even those substrates with water repellency may be used, as long as they are given the similar surface treatment.

[4-2. Conductive Solution and Insulating Solution]

Now, the conductive solution and insulating solution used in this embodiment will be explained.

The conductive solution used in this embodiment includes water and a conductive material. Water used to prepare the conductive solution is preferably industrial water removed of cations and anions by a deionization process. The amount of water in the conductive solution is determined in a wide range according to a water percentage required or characteristics required of the conductive solution. Generally, the water content falls in a range of 10-98 weight percentage and, preferably, in a range of 40-90 weight percentage.

A conductive material used in the conductive solution is, for example, metal superfine particles less than 1-100 nm in average diameter, which are manufactured by laser abrasion. The metal superfine particles may include, for example, ITO (indium-tin oxide) and $SnO_2$ (tin oxide).

The insulating solution used in this invention contains water, an insulating material and a second component. The second component is an alkaline water solution which, when it comes into contact with the conductive material used in the conductive solution, causes an interface coagulation at a contact area by a coagulation sedimentation reaction based on a pH difference, preventing a mixing or bleeding of the conductive solution and the insulating solution, keeping these solutions isolated from each other. This alkaline water solution evaporates during thermosetting processing performed as post processing. The water used in the insulating solution may be the one used in the conductive solution.

A material that may be used as the second component includes any kind of polymer, such as an anionic water-soluble polymer and a volatile amine. The anionic water-soluble polymer as the second component may include ammonium salt, and the volatile amine may include ammonium hydroxide. As the insulating material, a nonionic polymer may be used. An example of the nonionic polymer includes a solder resist containing epoxy resin as the main component.

5. Circuit Pattern Forming Process

First Embodiment

FIGS. 9A to 9H are a sequence of steps performed by the circuit pattern forming device in the first embodiment of this invention. In the first embodiment, a liquid ejection head 2 shown in FIG. 2 is used. Since an ejected large droplet 10 needs to contact both of the two adjoining large dots 12 formed on the substrate, the conductive nozzle array 30a can eject a droplet 10 of a greater diameter than the interval between the two large dots 12, as shown in FIG. 10.

First, let us explain a first ejection step.

Figure 9A:
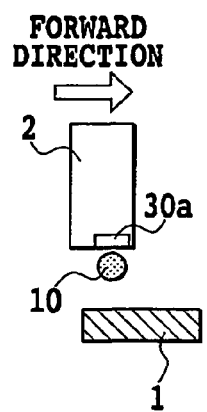
FIGS. 9A to 9H illustrate a sequence of steps executed in a circuit pattern forming method in the first embodiment of this invention.
Figure 9B:
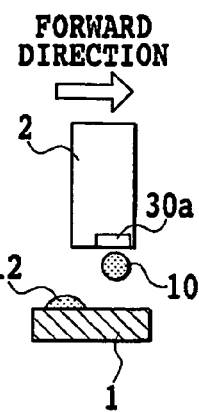
Figures 9C, 9D:
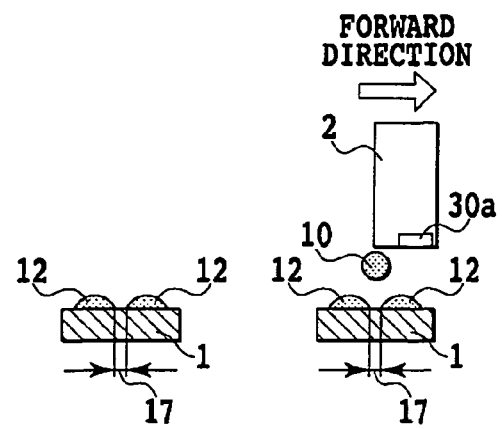
Figure 10:
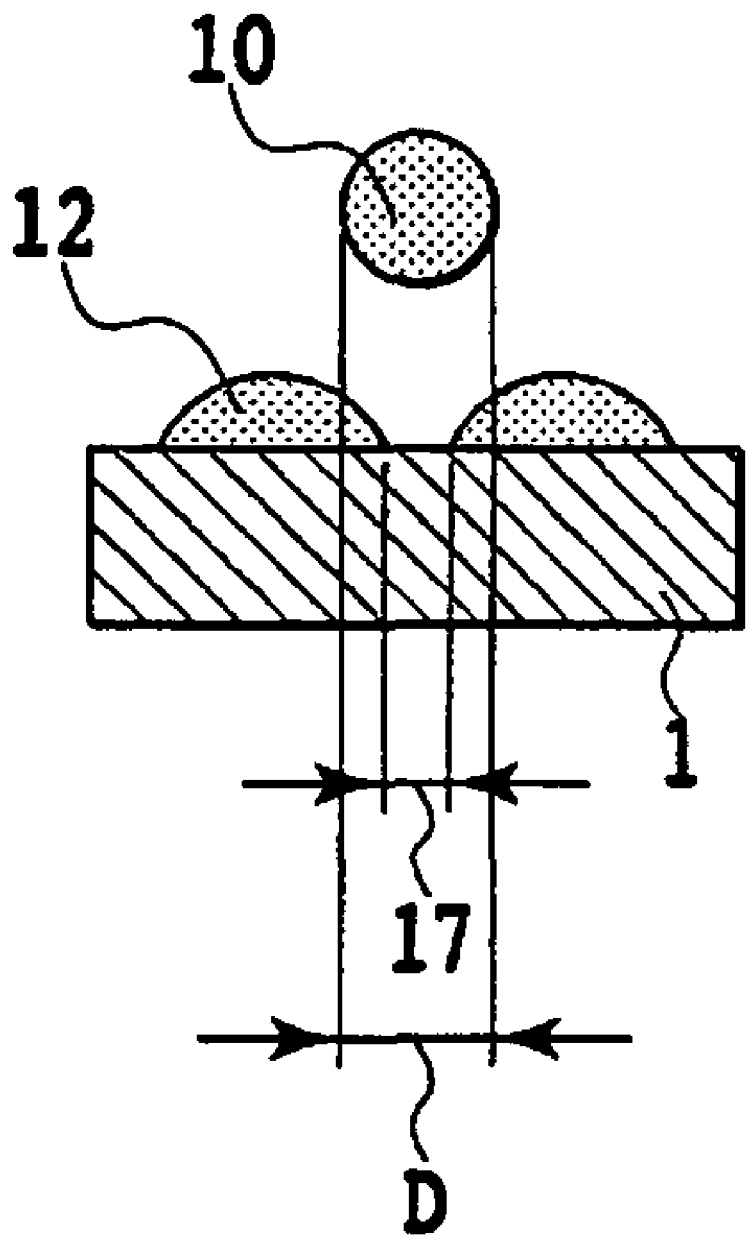
FIG. 10 is a diagram showing a relation between an interval of adjoining dots formed on a substrate and a diameter of ink droplets ejected between the existing, adjoining dots, in the first embodiment of this invention.

As shown in FIG. 9A, the liquid ejection head 2 is moved to one end (left end in the figure) of the substrate 1, which is the drawing start position. Then, while the head 2 is moved in the forward direction of the main scan (from left to right in the figure), the large nozzle 20 ejects large droplets 10 onto the substrate 1, as shown in FIGS. 9A and 9B. In this first ejection step, the droplets 10 are ejected so that the large dots 12 formed by the droplets landing on the substrate 1 do not overlap each other, as shown in FIG. 9C. In this way, the large dots 12 are formed on the substrate 1 at predetermined positions and prevented from spreading by the surface tension of the insulating solution. Therefore, a gap 17 is formed between the adjoining large dots 12, 12 ejected onto the substrate 1 in the first ejection step, as shown in FIG. 9C.

Next, a second ejection step will be explained.

Figure 9E:
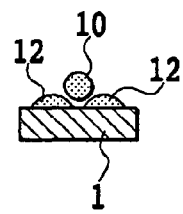
Figure 9F:
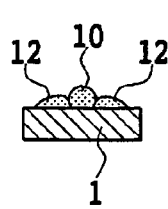
Figure 9G:
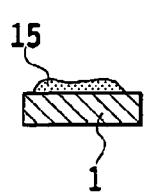
Figure 9H:
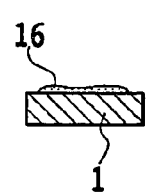

After the large liquid dots 12 are formed on the substrate 1 by the first ejection step, the head 2 is immediately returned to the drawing start position (left end of the substrate 1). Then, as the head 2 is moved again in the forward direction, large droplets 10 of the insulating solution are ejected between the existing, adjoining large dots 12, 12 on the substrate 1, as shown in FIGS. 9D and 9E, in the second ejection step, before the large dots 12 on the substrate 1 turn from liquid to gel (solidified state). Since the large dots 12 have not jelled when the large droplets 10 of the insulating solution contact the large dots 12, the landing droplets are attracted to and mix with them, as shown in FIG. 9F. As a result, as shown in FIG. 9G, the large droplet 10 and the two large dots 12 merge, forming a flat, nearly uniform linear pattern 15. Then, by heating the substrate 1 with the heater, an insulating pattern 16 of a flat, uniform thin film is obtained, as shown in FIG. 9H.

In this second ejection step, because two large dots 12 and a large droplet 10 need to contact each other, the diameter D of the large droplet 10 must be larger than the gap 17 between the two large dots formed on the substrate, as shown in FIG. 10.

After the insulating pattern has been formed, as described above, the liquid ejection head 3 ejects a conductive solution to form a conductive pattern in a similar manner. By forming the conductive pattern also in the same procedure shown in FIGS. 9A to 9H, a conductive pattern of a flat, uniform thin film can be obtained.

While FIGS. 9A to 9H have shown the large droplets 10 to be ejected as the head moves from the left end, the droplet ejection may be performed while the head moves in the opposite direction (from the right end). Further, the relative motion between the head 2 and the substrate 1 may consist of both the forward and backward movements, and the first ejection step may be executed during the forward movement and the second ejection step during the backward movement. This forward and backward ejection enables a high speed pattern forming.

The definition of the gap used in this specification will be described. FIGS. 11A to 11C schematically show an array of dots formed on the substrate 1, as seen from above. FIG. 11A shows dots 12 arranged in parallel at intervals that prevent them from overlapping. Other than those areas where the large dots 12 are formed, i.e., areas enclosed by the dots and areas between the dots are gaps 17. FIG. 11B illustrates a case where the gaps 17 are filled with large droplets 10 of the same size as those used in the first ejection step. In this case, when a large droplet 10 lands on a gap A, it contacts the existing large dots 12 that have already landed on the substrate 1, resulting in the liquids being mixed, as shown in FIG. 9F. When a small gap exists between the adjoining two large dots 12, such as a gap B in FIG. 11C, a small droplet 11 of a smaller size than that used in the first ejection step may be ejected.

Though not shown, the forming of the insulating pattern and the conductive pattern on the second and subsequent layer can be performed in a manner similar to that used for the first layer pattern.

Second Embodiment

Next, a second embodiment of this invention will be explained.

FIGS. 12A to 12J show a sequence of steps performed by a circuit pattern forming method in the second embodiment.

In the second embodiment, the insulating pattern and the conductive pattern are formed simultaneously.

Let us first explain a first ejection step.

As shown in FIG. 12A, the liquid ejection heads 2, 3 are moved to one end of the substrate (left end in the figure), which is the drawing start position. Then, as shown in FIGS. 12A and 12B, the heads 2, 3 are moved in the forward direction of the main scan (from left to right in the figure) and, at the same time, eject a large droplet 10a onto the substrate 1. At this time, the ejection of the droplets 10a is done in such a manner that the large dots 12a formed by the droplets 10a landing on the substrate 1 do not overlap, as shown in FIG. 12C. These large dots 12a are formed at predetermined positions on the substrate 1 and are prevented from spreading by the surface tension of the conductive solution. Thus, between the adjoining large dots 12a, 12a ejected onto the substrate 1 by the first ejection step, a gap 17a is formed, as shown in FIG. 12C.

Next, as shown in FIG. 12D, a large droplet 10b of the insulating solution is ejected from a large nozzle 20 of the nozzle array 30a of the head 3, to land on the substrate 1. Further, as shown in FIG. 12D, a large droplet 10b is ejected as the heads 2, 3 are moved in the forward direction. The ejection of droplets 10b of the insulating solution is also done in such a manner that the large dots 12b formed by the droplets 10b landing on the substrate 1 do not overlap, as shown in FIG. 12E. Thus, between the adjoining dots 12b, 12b there is formed a gap 17b.

Next, a second ejection step will be described.

After large liquid dots 12a, 12b have been formed on the substrate 1 by the first ejection step, the liquid ejection heads 2, 3 are immediately returned to the drawing start position (left end of the substrate 1). Then, before the large dots 12a, 12b on the substrate 1 turn from liquid into a gel state, a large droplet 10a of the conductive solution is ejected onto the gap 17a between the dots 12a, 12a that were formed on the substrate 1 in the first ejection step, as shown in FIG. 12E. Further, a large droplet 10b of the insulating solution, too, is similarly ejected onto the gap 17b between the large dots 12b, 12b that were formed on the substrate 1 in the first ejection step by moving the heads 2, 3 in the forward direction (see FIGS. 12F and 12G).

At this time, since the large dots 12a, 12b formed in the first ejection step have not yet gelled, when the large droplet 10a comes into contact with the large dots 12a, they attract each other and mix, as shown in FIG. 12G. As a result, one large droplet 10a and two large dots 12a merge together to form a line pattern 15a (see FIG. 12I). When the large droplet 10b of the insulating solution also comes into contact with the large dots 12b, they attract each other and merge together. As a result, a line pattern 15b of a flat, thin film, almost uniform in thickness, is obtained (see FIG. 12I). Then, by heating the substrate 1 with a heater, a conductive pattern 16a and an insulating pattern 16b, both formed of a flat, thin film, with an almost uniform thickness, can be produced.

Although an example case in which a single layer circuit board is fabricated has been described by referring to FIGS. 12A to 12J, multilayered circuit boards can be made by laminating the conductive pattern 16a and the insulating pattern 16b.

Further, in a pattern forming method using materials that can be ejected in a liquid state, a wide range of materials, including conductive patterns, insulating patterns and semiconductive materials, can, of course, be applied.

FIGS. 13A to 13F show a sequence of steps in forming a three-layer circuit board as a multilayered circuit board.

Figure 13A:
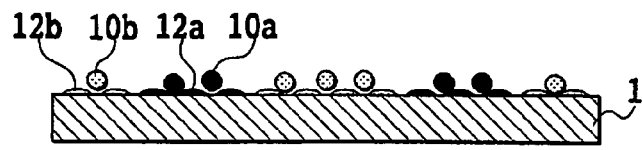
FIGS. 13A to 13F are a sequence of steps executed by a method of forming a three-layer circuit board as a multilayered circuit board in the second embodiment of this invention.
Figure 13B:
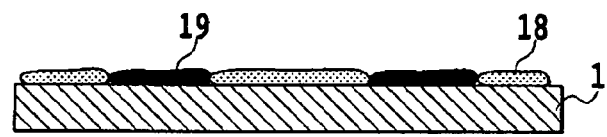

First, in forming a first layer, the insulating solution and the conductive solution are used, and large droplets are ejected to a gap between large dots, as in the first and second ejection steps, to form patterns of a thin film almost uniform in thickness, as shown in FIG. 13A. Then, the patterns are heat-treated to fix the first layer, as shown in FIG. 13B.

Figure 13C:
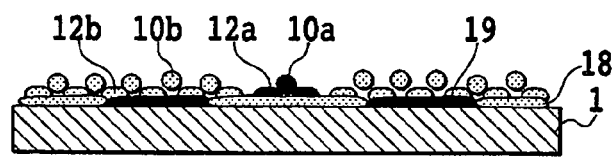
Figure 13D:
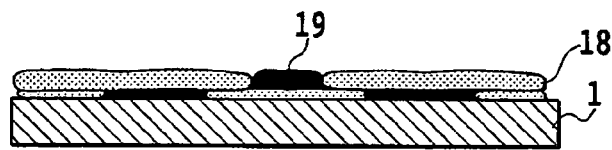

Next, a second layer is formed over the first layer. This involves, as shown in FIG. 13C, forming an insulating pattern and a conductive pattern over the fixed first layer by performing the first and second ejection steps, as with the first layer. Then, the second layer is fixed by a heat-treatment (see FIG. 13D).

Figure 13E:
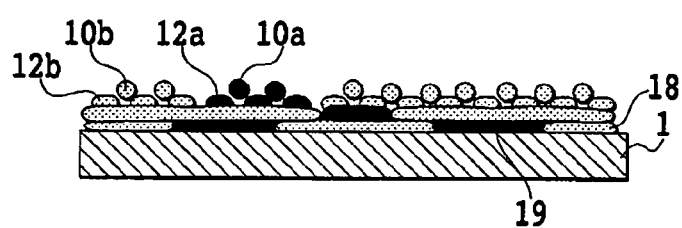
Figure 13F:
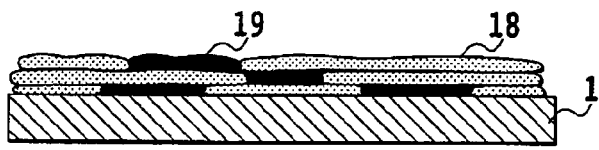

A third layer is made by performing the pattern forming as with the first and second layer (see FIG. 13E). The pattern is then heat-treated to fix the third layer, as shown in FIG. 13F. Even in the circuit board formed with three layers, the individual layers can be formed thin, and almost uniform in thickness.

Third Embodiment

Next, a third embodiment of this invention will be described.

Figure 14:
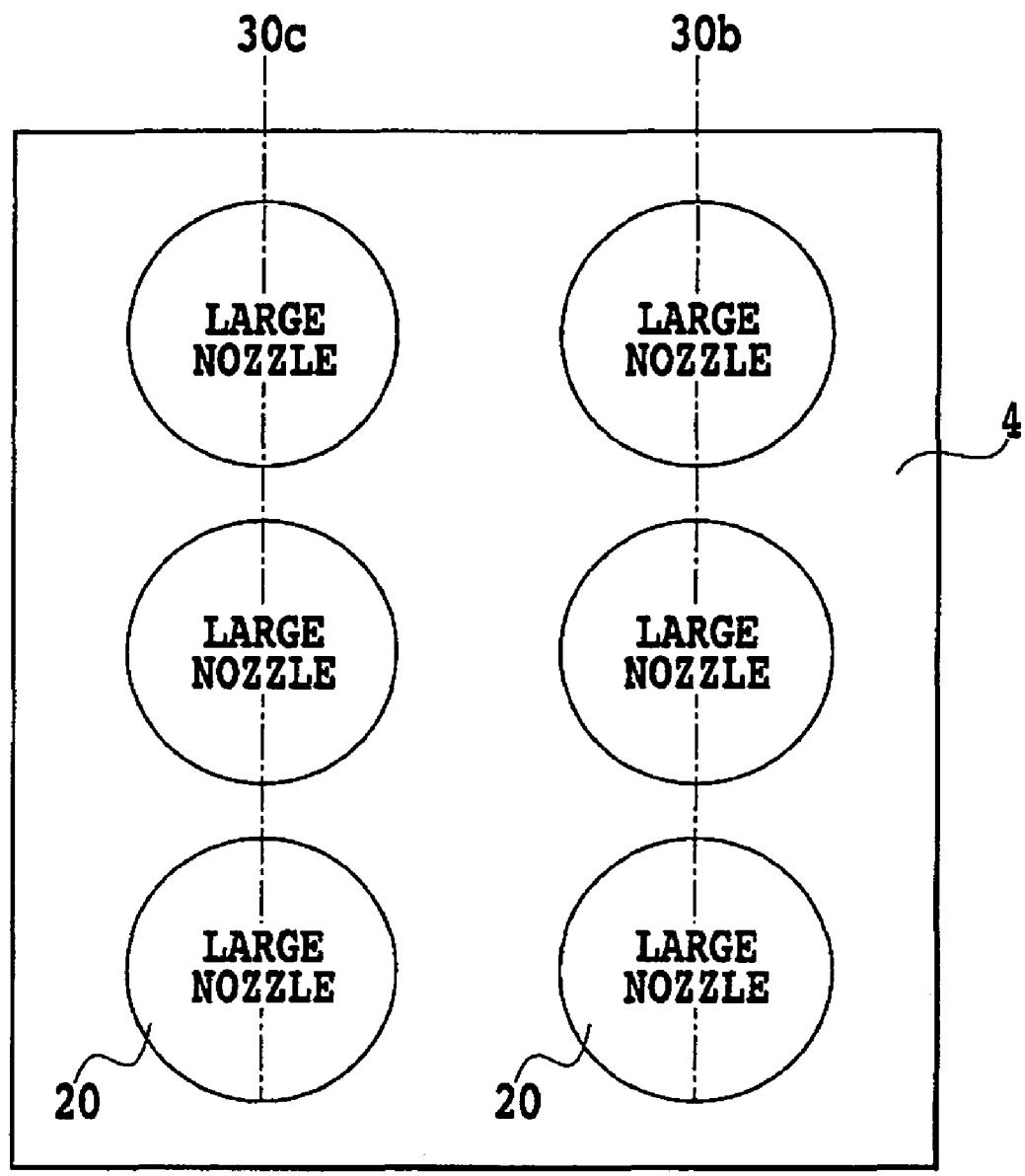
FIG. 14 is a bottom view schematically showing a nozzle array arranged on an orifice face of a liquid ejection head used in a third embodiment of this invention.

FIG. 14 is a bottom view schematically showing nozzle arrays arranged in an orifice face of the liquid ejection head used in the third embodiment. FIGS. 15A to 15F schematically show a sequence of steps performed in a circuit pattern forming method of the embodiment.

If the solutions used (insulating solution and conductive solution) have a characteristic that they turn from a liquid to a gel in a short period of time, the third embodiment makes it possible for large dots formed in the first ejection step and large droplets ejected in the second ejection step to mix, by shortening a process time taken from the first ejection step to the second ejection step.

As shown in FIG. 14, a liquid ejection head 4 has two arrays 30b, 30c of large nozzles 20, arrayed at equal intervals, for ejecting large droplets. Though not shown, also in the third embodiment, the liquid ejection head 4 for ejecting the insulating solution and another head of the same construction for ejecting conductive solution are arranged side by side, as in the preceding embodiments.

By referring to FIGS. 15A to 15F, the circuit pattern forming process in the third embodiment will be explained. Here, we will take up an example case of ejecting an insulating solution. The ejection of a conductive solution can also apply the similar method.

When an insulating solution with a long fixing time (the time it takes for the ejected droplets to change state from liquid to gel) is used, the liquid ejection head needs to be moved to the drawing start position (left end of the substrate 1) before initiating the second ejection step, as in the first and second embodiments. If, however, this method is applied to a solution with a short fixing time characteristic, large dots ejected in the first ejection step may solidify during a period from the first ejection step to the second ejection step, resulting in the droplets ejected in the two ejection steps failing to mix together. To deal with this problem, the third embodiment executes the first ejection step and the second ejection step in one and the same scan of the head 4, so as to eject droplets in the second ejection step before the dots formed in the first ejection step solidify.

Figure 15:
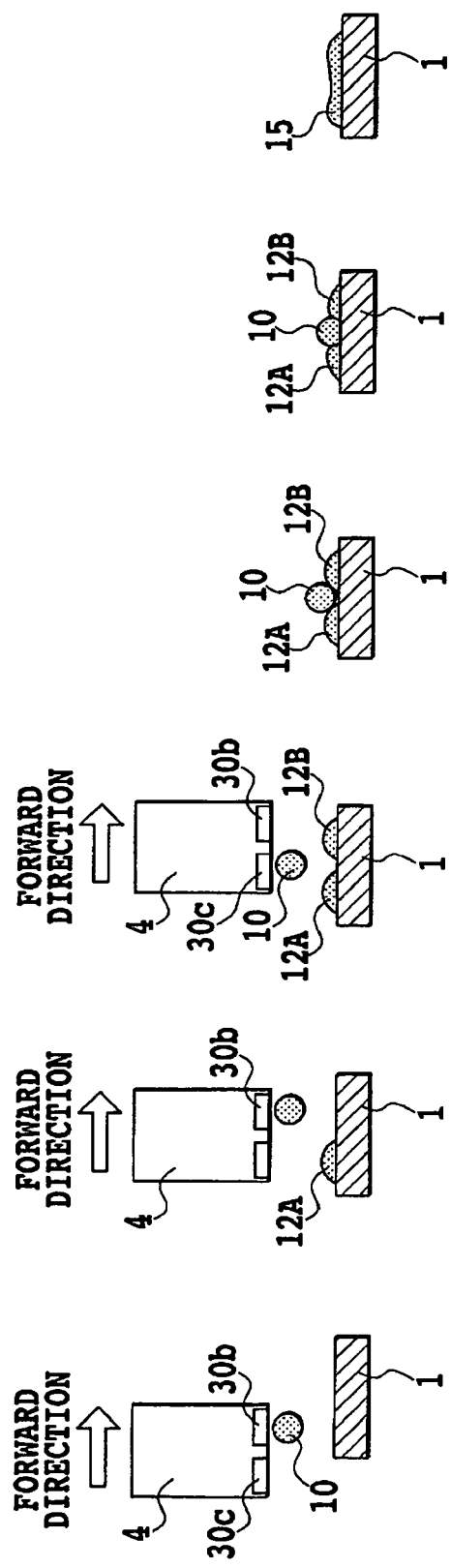
FIGS. 15A to 15F are a sequence of steps executed in a circuit pattern forming method in the third embodiment of this invention.

That is, as shown in FIG. 15A, the head 4 is moved to the left end (left in the figure) of the substrate 1, or the drawing start position. Then, as shown in FIGS. 15A and 15B, a large droplet 10 is ejected to land on the substrate 1 as the head is moved in the forward direction (from left to right in the figure). At this time, the droplet ejection is performed so that the adjoining large dots 12A, 12B formed on the substrate 1 do not overlap. This ejection step is the first ejection step.

Next, after a large dot 12B of the insulating solution has been formed on the substrate 1, the nozzle array 30c, situated directly behind in the scan direction, ejects a large droplet of the insulating solution from a nozzle 20 (see FIG. 15C) in the same scan operation to land between the adjoining large dots 12A, 12B (FIG. 15D). This is the second ejection step in the third embodiment. That is, rather than performing a second ejection step after moving the head 4 to the ejection start position (left end of the substrate 1) as the first and second embodiments do, this third embodiment initiates the second ejection step just from where the first ejection step has been finished, as shown in FIG. 15C. Therefore, a large droplet 10 can be made to land almost without a time delay from when the large dots 12A, 12B are formed. This means that, if the large dots 12A, 12B that have already landed tend to solidify easily, a large droplet can be made to land before the preceding dots solidify (gel). Then, when a large droplet 10 of the insulating solution contacts the large dots 12A, 12B, as shown in FIG. 15D, they attract each other through contact portions and mix together (FIG. 15E). The large droplet 10 and two large dots 12 merge, forming a line pattern 15 of a flat, thin film with an almost uniform thickness (FIG. 15F).

Fourth Embodiment

Next, a fourth embodiment of this invention will be explained.

Figure 16:
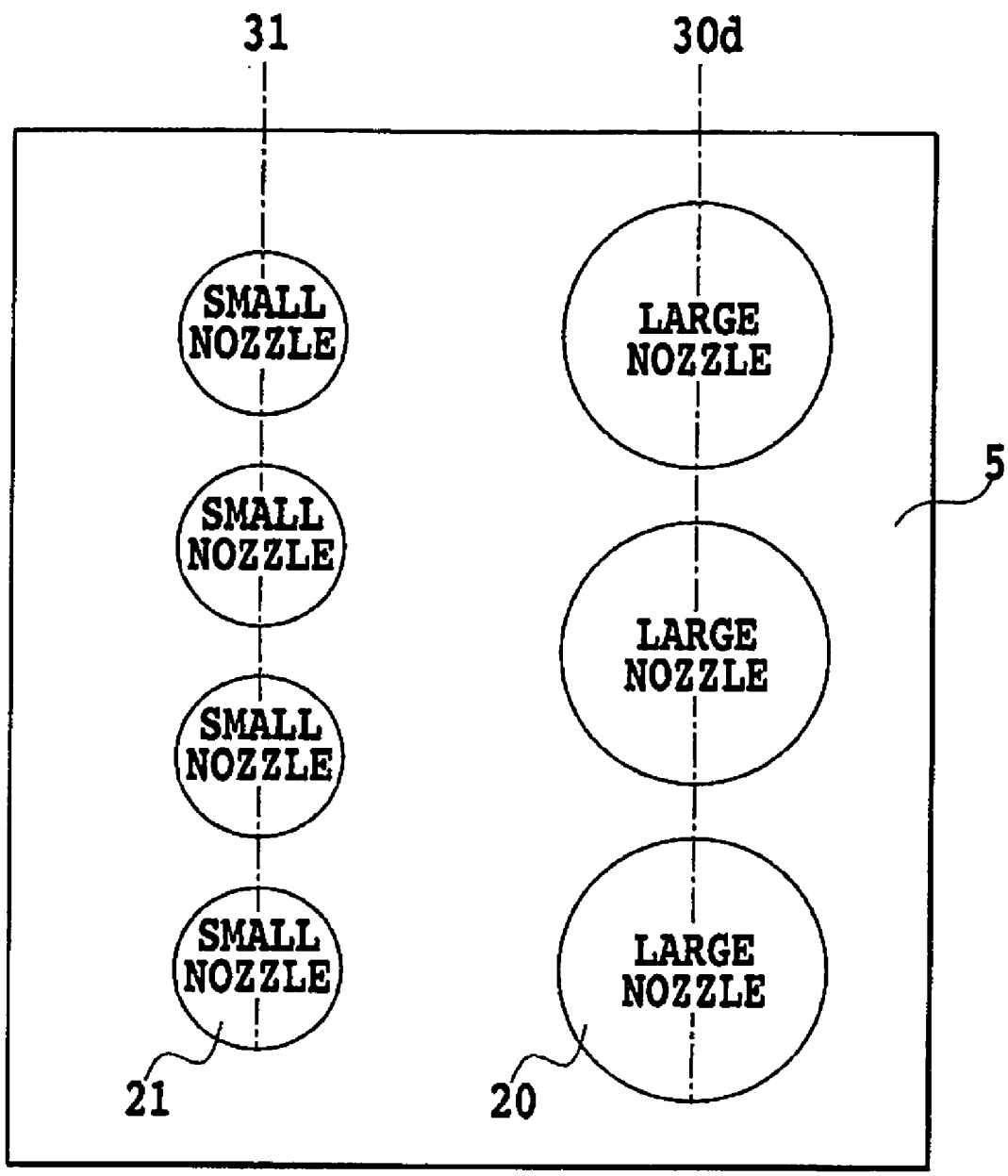
FIG. 16 is a bottom view schematically showing a nozzle array arranged on an orifice face of a liquid ejection head used in a fourth embodiment of this invention.

FIG. 16 is a bottom view schematically showing nozzle arrays arranged in an orifice face of the liquid ejection head used in the fourth embodiment. FIGS. 17A to 17F show a sequence of steps performed in the circuit pattern forming method of this embodiment.

As shown in FIGS. 17A to 17F, if a gap between the large dots 12A and 12B formed on the substrate 1 in the first ejection step is small, the fourth embodiment of this invention reduces the size of droplets used in the second ejection step, so as to prevent the droplets from spreading, and to ensure that the small droplet 11 mixes well with the large dots 12A, 12B.

For this purpose, the fourth embodiment uses a liquid ejection head 5 shown in FIGS. 17A to 17F. The liquid ejection head 5 of FIGS. 17A to 17C has an array 30*d* of large nozzles 20 arranged at equal intervals to eject large droplets, and an array 31 of small nozzles arranged at equal intervals to eject small droplets, the large nozzle array and the small nozzle array being placed side by side. Though not shown here, also in the fourth embodiment, the liquid ejection head 5 for ejecting the insulating solution and another head of similar construction for ejecting the conductive solution are arranged side by side, as in the preceding embodiments.

By referring to FIG. 16, the circuit pattern forming process in the fourth embodiment will be explained.

The method of changing the size of droplets used in the first ejection step and the second ejection step, as the fourth embodiment of this invention, will be explained. Also in the fourth embodiment, the insulating solution is used as an example. A similar method can also be applied for the conductive solution.

Figures 17A, 17B, 17C, 17D, 17E, 17F:
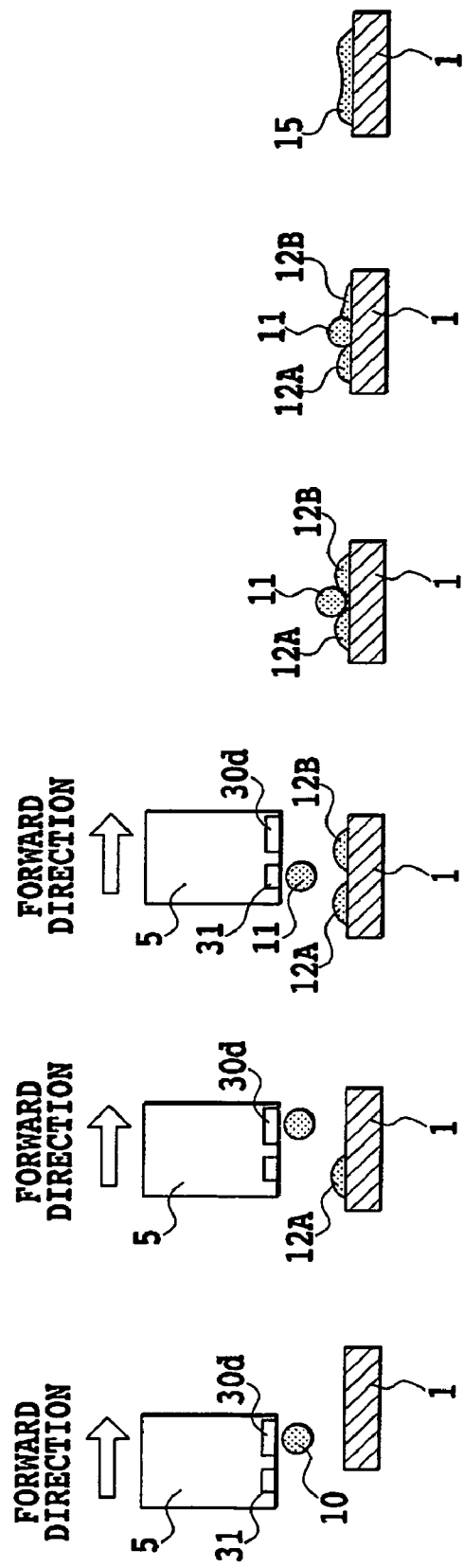
FIGS. 17A to 17F are a sequence of steps executed in a circuit pattern forming method in the fourth embodiment of this invention.
Figure 18:
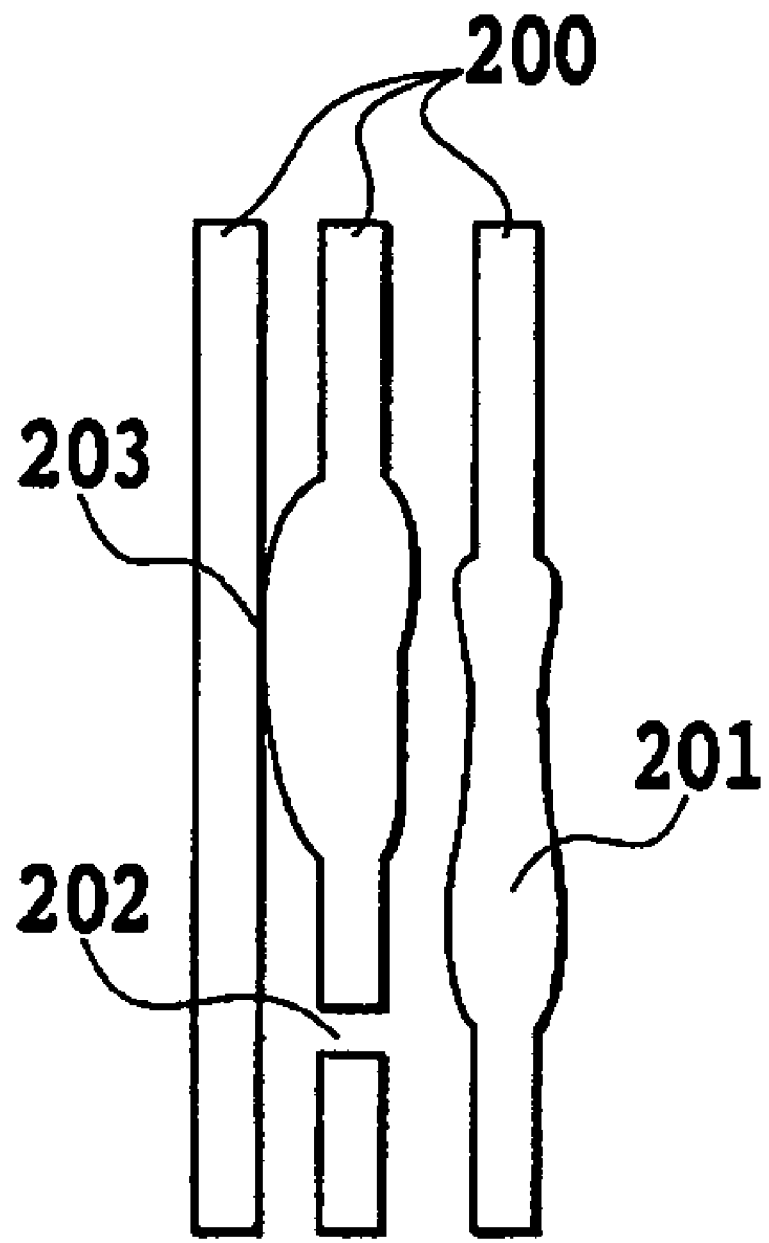
FIG. 18 shows liquid puddles, open-circuits and short-circuits formed in a conventional circuit pattern forming process.
Figures 19A, 19B:
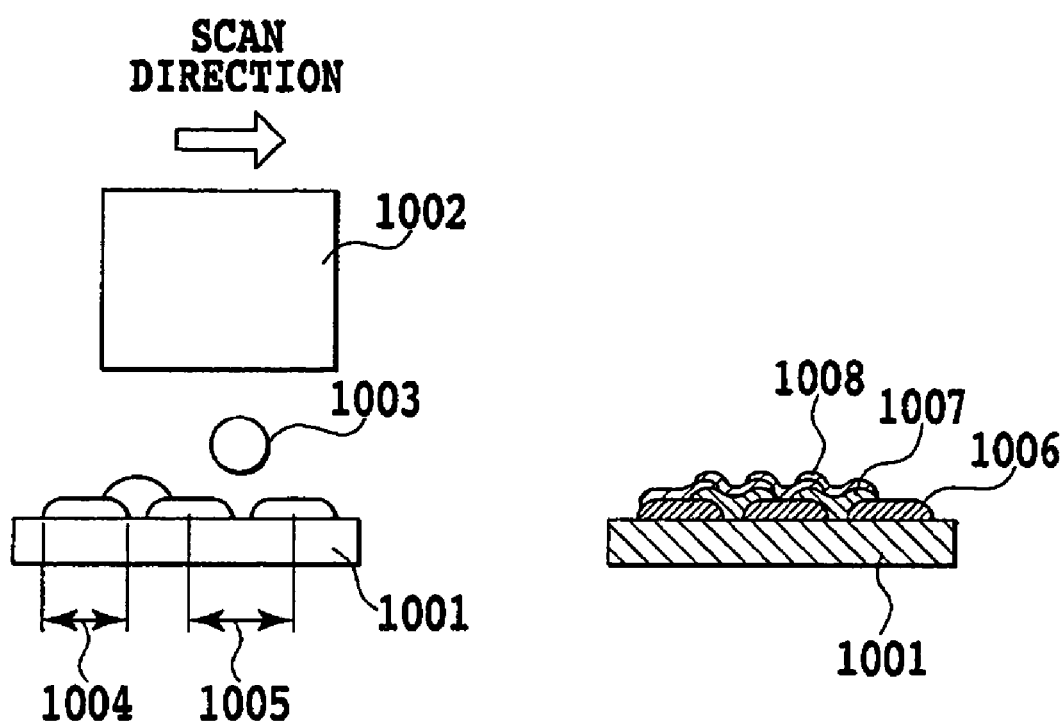
FIGS. 19A and 19B illustrate a conventional circuit pattern forming method.

First, as shown in FIG. 17A, the liquid ejection head 5 is moved to the left end of the substrate 1 (left side in the figure), the drawing start position, and then, a large droplet 10 of the insulating solution is ejected from the large nozzle 20 of the array 30*b* of the head 5 to land on the substrate 1. As the head 5 is moved in the scan direction (from left to right in the figure), a large droplet 10 is ejected to land on the substrate 1, as shown in FIG. 17B, in the first ejection step. At this time, the ejection is executed so that the adjoining large dots 12A, 12B formed on the substrate 1 do not overlap. This is the first ejection step.

Next, the second ejection step will be explained.

Also in the fourth embodiment, the second ejection step is initiated without moving the head 5 to the drawing start position (left end of the substrate 1), as in the case of the third embodiment. That is, as shown in FIG. 17C, when large dots 12A, 12B are formed in the first ejection step, a small droplet 11 of the insulating solution is ejected from a small nozzle 21 of the array 31 to a gap between the large dots 12A, 12B. When this small droplet 11 contacts the large dots 12A, 12B (FIG. 17D), they attract each other through the contact portions and mix together (FIG. 17E). Then, the small droplet 11 and the two large dots 12 merge together. As a result, a line pattern of a flat, thin film with an almost uniform thickness can be produced (FIG. 17F).

As described above, in the fourth embodiment, the droplet ejected in the second ejection step is reduced in size according to a narrow gap 17 between the large dots 12A, 12B formed in the first ejection step, so the merge of the droplet with the large dots prevents the droplet from spreading outwardly, assuring a more precise forming of circuit patterns.

The present invention has been described in detail with respect to preferred embodiments, and it will now be apparent from the foregoing to those skilled in the art that changes and modifications may be made without departing from the invention in its broader aspect, and it is the intention, therefore, in the appended claims, to cover all such changes and modifications that fall within the true spirit of the invention.

What is claimed is:

1. A circuit pattern forming method comprising:
    a first ejection step of ejecting large droplets of a circuit pattern forming liquid onto a substrate, by causing a liquid ejection head to scan the substrate, to form first dots of the liquid on the substrate with gaps between the first dots;
    a second ejection step of ejecting, from the liquid ejection head, in the same scan of the liquid ejection head as that of the first ejection step, after ejecting the large droplets and before the first dots formed on the substrate solidify, a small droplet, which is smaller in size than the large droplets, to form a second dot of the liquid between the first dots of the liquid already formed on the substrate, and thereby to form a liquid circuit pattern by mixing the first dots and the second dot together; and
    a fixing step of solidifying the liquid circuit pattern to form a circuit pattern on the substrate.

2. A circuit pattern forming method according to claim 1, wherein the first ejection step, the second ejection step and the fixing step are repetitively performed on the circuit pattern formed on the substrate to form a circuit pattern of a laminated layer structure.

3. A circuit pattern forming method according to claim 1, wherein a diameter of the small droplet ejected in the second ejection step is larger than the gap between the first dots formed on the substrate in the first ejection step, which need to be connected.

4. A circuit pattern forming method according to claim 1, wherein the circuit pattern forming liquid includes at least one of (i) a conductive solution containing conductive particles to form a conductive pattern and (ii) an insulating solution containing insulating particles to form an insulating pattern.

\* \* \* \* \*